US012051183B2

(12) United States Patent
Grama et al.

(10) Patent No.: US 12,051,183 B2
(45) Date of Patent: Jul. 30, 2024

(54) TRAINING A MACHINE LEARNING MODEL TO GENERATE HIGHER RESOLUTION IMAGES FROM INSPECTION IMAGES

(71) Applicant: KLA Corporation, Milpitas, CA (US)

(72) Inventors: Kedar Grama, Fremont, CA (US); Santosh Kumar, San Jose, CA (US)

(73) Assignee: KLA Corp., Milpitas, CA (US)

( * ) Notice: Subject to any disclaimer, the term of this patent is extended or adjusted under 35 U.S.C. 154(b) by 594 days.

(21) Appl. No.: 17/238,106

(22) Filed: Apr. 22, 2021

(65) Prior Publication Data

US 2021/0343001 A1 Nov. 4, 2021

Related U.S. Application Data

(60) Provisional application No. 63/017,674, filed on Apr. 30, 2020.

(51) Int. Cl.
*G06T 7/00* (2017.01)
*G06N 3/04* (2023.01)
(Continued)

(52) U.S. Cl.
CPC .......... *G06T 7/0004* (2013.01); *G06N 3/045* (2023.01); *G06N 20/00* (2019.01);
(Continued)

(58) Field of Classification Search
CPC ....... G06T 7/00; G06T 7/0002; G06T 7/0004; G06T 7/0006; G06T 7/344; G06T 5/00; G06T 3/4053; G06T 2207/20081; G06T 2207/20084; G06T 2207/20172; G06T 2207/30004; G06T 2207/30148; G06T 2207/30108; G06T 2207/30168;
(Continued)

(56) References Cited

U.S. PATENT DOCUMENTS

| 6,902,855 B2 | 6/2005 | Peterson et al. |
| 7,418,124 B2 | 8/2008 | Peterson et al. |

(Continued)

FOREIGN PATENT DOCUMENTS

WO 2020/056274 3/2020

OTHER PUBLICATIONS

International Search Report for PCT/US2021/029270 mailed Aug. 13, 2021.
(Continued)

*Primary Examiner* — Edward F Urban
*Assistant Examiner* — Duy Tran
(74) *Attorney, Agent, or Firm* — Ann Marie Mewherter

(57) ABSTRACT

Methods and systems for determining information for a specimen are provided. The embodiments described herein are configured for training a machine learning (ML) model for generating higher resolution images of a specimen from images of the specimen generated by an inspection subsystem. The training includes a pre-training step that is performed using only simulated images and a re-training step that is performed using actual images of a test specimen. The higher resolution images generated by the trained ML model from lower resolution inspection images can be used for applications to including nuisance filtering and defect classification.

20 Claims, 8 Drawing Sheets

(51) Int. Cl.
 *G06N 3/045* (2023.01)
 *G06N 20/00* (2019.01)

(52) U.S. Cl.
 CPC .............. *G06T 2207/20081* (2013.01); *G06T 2207/20084* (2013.01); *G06T 2207/30148* (2013.01)

(58) Field of Classification Search
 CPC .......... G06N 20/00; G06N 3/045; G06N 3/00; G06N 5/00
 See application file for complete search history.

(56) References Cited

U.S. PATENT DOCUMENTS

| | | | |
|---|---|---|---|
| 7,570,796 | B2 | 8/2009 | Zafar et al. |
| 7,676,077 | B2 | 3/2010 | Kulkarni et al. |
| 7,729,529 | B2 | 6/2010 | Wu et al. |
| 7,769,225 | B2 | 8/2010 | Kekare et al. |
| 8,041,106 | B2 | 10/2011 | Pak et al. |
| 8,111,900 | B2 | 2/2012 | Wu et al. |
| 8,126,255 | B2 | 2/2012 | Bhaskar et al. |
| 8,213,704 | B2 | 7/2012 | Peterson et al. |
| 8,664,594 | B1 | 4/2014 | Jiang et al. |
| 8,692,204 | B2 | 4/2014 | Kojima et al. |
| 8,698,093 | B1 | 4/2014 | Gubbens et al. |
| 8,716,662 | B1 | 5/2014 | MacDonald et al. |
| 9,222,895 | B2 | 12/2015 | Duffy et al. |
| 10,186,026 | B2 | 1/2019 | Karsenti et al. |
| 2017/0193400 | A1* | 7/2017 | Bhaskar ................. G01Q 30/02 |
| 2017/0193680 | A1* | 7/2017 | Zhang .................... G06V 10/82 |
| 2017/0213067 | A1* | 7/2017 | Padmanabhan ...... G06V 20/695 |
| 2017/0357911 | A1* | 12/2017 | Liu ........................ G06N 20/10 |
| 2018/0060702 | A1* | 3/2018 | Ma ....................... G06V 10/764 |
| 2018/0293721 | A1 | 10/2018 | Gupta et al. |
| 2019/0096056 | A1* | 3/2019 | Giering ............... G06V 10/764 |
| 2019/0257767 | A1* | 8/2019 | Shaubi ................. G06T 7/0004 |
| 2020/0098101 | A1 | 3/2020 | Pandey et al. |

OTHER PUBLICATIONS

Goodfellow et al., "Generative Adversarial Nets," arXiv:1406.2661, Jun. 10, 2014, 9 pages.
Isola et al., "Image-to-Image Translation with Conditional Adversarial Networks," arXiv:1611.07004v2, Nov. 22, 2017, 17 pages.
Kingma et al., "Semi-supervised Learning with Deep Generative Models," NIPS 2014, arXiv:1406.5298v2, Oct. 31, 2014, 9 pages.
Makhzani et al., "Adversarial Autoencoders," arXiv:1511.05644v2, May 25, 2016, 16 pages.
Mirza et al., "Conditional Generative Adversarial Nets," arXiv:1411.1784, Nov. 6, 2014, 7 pages.
Niu et al., "A Pretraining-Retraining Strategy of Deep Learning Improves Cell-Specific Enhancer Predictions," Frontiers in Genetics, vol. 10, No. 1305, Jan. 2020, pp. 2-9.

* cited by examiner

TRAINING A MACHINE LEARNING MODEL TO GENERATE HIGHER RESOLUTION IMAGES FROM INSPECTION IMAGES

BACKGROUND OF THE INVENTION

1. Field of the Invention

The present invention generally relates to methods and systems for determining information for a specimen using a trained machine learning model.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on specimens to drive higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on specimens where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on specimens, metrology processes are used to measure one or more characteristics of the specimens that cannot be determined using currently used inspection tools. For example, metrology processes are used to measure one or more characteristics of specimens such as a dimension (e.g., line width, thickness, etc.) of features formed on the specimens during a process such that the performance of the process can be determined from the one or more characteristics. In addition, if the one or more characteristics of the specimens are unacceptable (e.g., out of a predetermined range for the characteristic(s)), the measurements of the one or more characteristics of the specimens may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on specimens may be independent of the results of an inspection process performed on the specimens. In particular, the locations at which a metrology process is performed may be selected independently of inspection results.

As described above, therefore, due to the limited resolution with which inspection (optical and sometimes electron beam inspection) is performed, the specimen is generally needed to generate additional higher resolution images for defect review of the defects detected on the specimen, which may include one or more of verification of the detected defects, classification of the detected defects, and determining characteristics of the defects. In addition, higher resolution images are generally needed to determine information for patterned features formed on the specimen as in metrology regardless of whether defects have been detected in the patterned features. Therefore, defect review and metrology can be time consuming processes that require use of the physical specimen itself and tools needed to generate the higher resolution images.

Defect review and metrology, however, are not processes that can be simply eliminated to save time and money. For example, due to the resolution with which inspection processes are performed, inspection processes do not in general generate image signals or data that can be used to determine information for the detected defects that is sufficient to classify the defects and/or determine a root cause of the defects. In addition, due to the resolution with which inspection processes are performed, inspection processes do not in general generate image signals or data that can be used to determine information for patterned features formed on the specimen with sufficient accuracy and/or precision.

There are two categories of methods that were previously used to improve resolution of optical images via computer-based post-processing. The first are super-resolution methods that use multiple views of the same location. Here, images of lower resolution are acquired with multiple optical modes, focus offsets, and/or perspectives. Higher resolution images are reconstructed either using optical models or learned methods with deep learning (DL) models. The second are DL models that use only an optical image to reconstruct a higher resolution image. They rely on learning the underlying distribution of characteristics of the higher resolution image like texture, edges, and shape models of objects.

There are, however, a number of disadvantages to the currently used computer-based methods for improving optical image resolution. For example, the super-resolution methods have a significant throughput impact on the optical tool. The factor by which the inspection slows down is directly proportional to the number of views that are required for the high-resolution reconstruction. The model-based methods are prone to producing artifacts as the information in the optical images is limited when sampled at the Nyquist rate, at which inspection tools are usually operated.

Accordingly, it would be advantageous to develop systems and methods for determining information for a specimen that do not have one or more of the disadvantages described above.

SUMMARY OF THE INVENTION

The following description of various embodiments is not to be construed in any way as limiting the subject matter of the appended claims.

One embodiment relates to a system configured to determine information for a specimen. The system includes an inspection subsystem configured to generate images of a specimen. The system also includes one or more computer subsystems and one or more components executed by the one or more computer subsystems. The one or more components include a trained machine learning (ML) model configured for transforming the images of the specimen generated by the inspection subsystem into higher resolution images of the specimen.

The one or more computer subsystems are configured for pre-training an initial ML model with a pre-training set thereby generating a pre-trained ML model. The pre-training set includes simulated inspection images of a test specimen designated as pre-training inputs and corresponding simulated higher resolution images of the test specimen designated as pre-training outputs.

The one or more computer subsystems are also configured for re-training the pre-trained ML model with a training set thereby generating the trained ML model. The training set includes images generated for the test specimen by the inspection subsystem designated as training inputs and corresponding higher resolution images of the test specimen generated by a high resolution imaging system designated as training outputs.

The one or more computer subsystems are further configured for inputting the images generated for the specimen by the inspection subsystem during inspection into the trained ML model to thereby generate the higher resolution images of the specimen. In addition, the one or more computer subsystems are configured for determining information for the specimen from the generated higher resolution images. The system may be further configured as described herein.

Another embodiment relates to a computer-implemented method for determining information for a specimen. The method includes the pre-training, re-training, inputting, and determining steps described above, which are performed by one or more computer systems. One or more components are executed by the one or more computer systems. The one or more components include the trained ML model configured for transforming images of a specimen generated by the inspection subsystem into higher resolution images of the specimen.

Each of the steps of the method may be performed as described further herein. The method may include any other step(s) of any other method(s) described herein. The method may be performed by any of the systems described herein.

Another embodiment relates to a non-transitory computer-readable medium storing program instructions executable on one or more computer systems for performing a computer-implemented method for determining information for a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
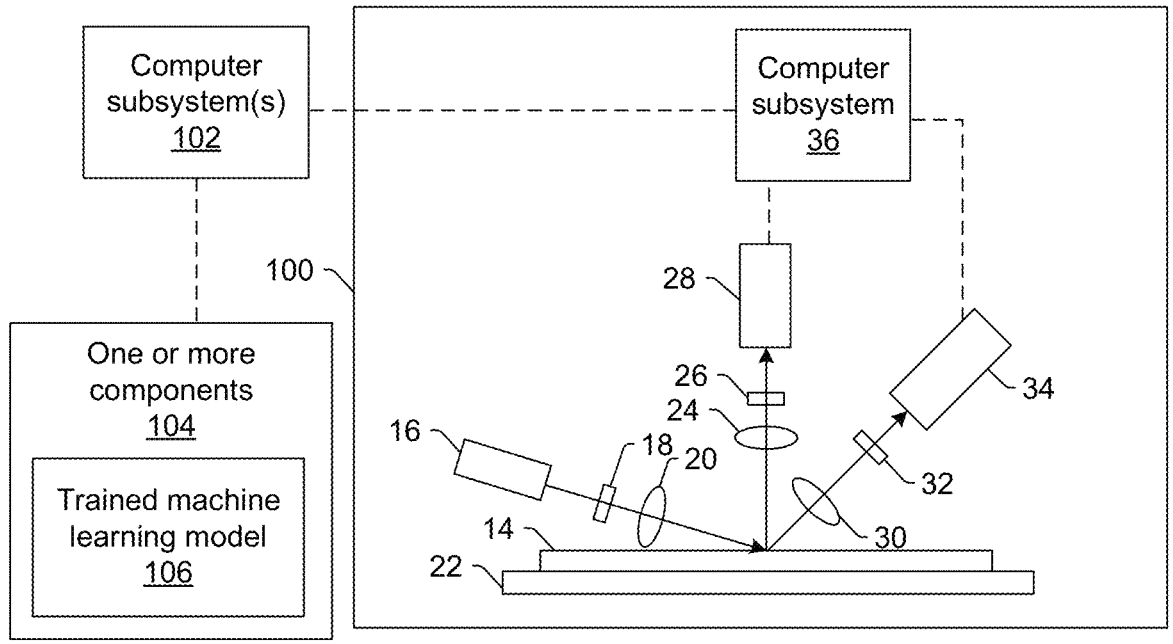
FIGS. 1 and 1a are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an IC or other semiconductor device and data derived from the physical design through complex simulation or simple geometric and Boolean operations. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data. Furthermore, the "design," "design data," and "design information" described herein refers to information and data that is generated by semiconductor device designers in a design process and is therefore available for use in the embodiments described herein well in advance of printing of the design on any physical specimens such as reticles and wafers.

A "design clip" as that term is used herein is generally defined as a relatively small portion of an entire design for a specimen. The term "design clip" is used interchangeably herein with the phrase "portion of design data."

"Nuisances" (which is sometimes used interchangeably with "nuisance defects" or "nuisance events") as that term is used herein is generally defined as defects that a user does not care about and/or events that are detected on a specimen but are not really actual defects on the specimen. Nuisances that are not actually defects may be detected as events due to non-defect noise sources on a specimen (e.g., grain in metal lines on the specimen, signals from underlaying layers or materials on the specimen, line edge roughness (LER), relatively small critical dimension (CD) variation in patterned features, thickness variations, etc.) and/or due to marginalities in the inspection system itself or its configuration used for inspection.

The term "defects of interest (DOIs)" as used herein is defined as defects that are detected on a specimen and are really actual defects on the specimen. Therefore, the DOIs are of interest to a user because users generally care about how many and what kind of actual defects are on specimens being inspected. In some contexts, the term "DOI" is used to refer to a subset of all of the actual defects on the specimen, which includes only the actual defects that a user cares about. For example, there may be multiple types of DOIs on any given specimen, and one or more of them may be of greater interest to a user than one or more other types. In the context of the embodiments described herein, however, the term "DOIs" is used to refer to any and all real defects on a specimen.

The term "low resolution image" of a specimen, as used herein, is generally defined as an image in which all of the patterned features formed in the area of the specimen at which the image was generated are not resolved in the image. For example, some of the patterned features in the area of the specimen at which a low resolution image was generated may be resolved in the low resolution image if their size is large enough to render them resolvable. However, the low resolution image is not generated at a resolution that renders all patterned features in the image resolvable. In this manner, a "low resolution image," as that term is used herein, does not contain information about patterned features on the specimen that is sufficient for the low resolution image to be used for applications such as defect review, which may include defect classification and/or verification, and metrology. In addition, a "low resolution image" as that term is used herein generally refers to images generated by inspection systems, which typically have relatively lower resolution (e.g., lower than defect review and/or metrology systems) in order to have relatively fast throughput.

The "low resolution images" may also be "low resolution" in that they have a lower resolution than a "high resolution image" described herein. A "high (or higher) resolution image" as that term is used herein can be generally defined as an image in which all patterned features of the specimen are resolved with relatively high accuracy. In this manner, all of the patterned features in the area of the specimen for which a high resolution image is generated are resolved in the high resolution image regardless of their size. As such, a "high resolution image," as that term is used herein, contains information about patterned features of the specimen that is sufficient for the high resolution image to be used for applications such as defect review, which may include defect classification and/or verification, and metrology. In addition, a "high resolution image" as that term is used herein generally refers to images that cannot be generated by inspection systems during routine operation, which are configured to sacrifice resolution capability for increased throughput.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are configured for generating higher resolution images (e.g., optical images) by leveraging design. The embodiments employ a deep learning (DL) method that reconstructs high resolution optical or other images from lower resolution images obtained from inspection tools, possibly with the aid of high resolution design information. The embodiments may leverage the availability of intended design data for two key steps. The first is for pre-training the network, which reduces the tool time required to acquire training images since a much smaller set of non-simulated specimen images is used for the final step of training. Second, the design data may be used as an additional channel of information used for the high resolution reconstruction.

Today, most advanced inspections (e.g., broad band plasma (BBP) optical inspection scans) sample at the Nyquist rate. At the Nyquist sampling rate, the image resolution is at the information theoretical limit of the inspection system. Any higher resolution will require a change in the light source and the imaging optics. The embodiments described herein provide a computer-based method for reconstructing high resolution images. The embodiments rely on the assumption that process variations that occur on the specimen are a subset of the possible perturbations to the design that can produce the observed inspection image. Resolving structures at higher resolutions enables improved sensitivity and helps classify defect types accurately. Increasing image resolution in the post-processing will potentially improve the throughout of the inspection tool as the inspections can be run at lower magnification.

In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, personal computer (PC) boards, and other semiconductor specimens.

One embodiment relates to a system configured to determine information for a specimen. One embodiment of such a system is shown in FIG. 1. The system includes one or more computer subsystems 102 and one or more components 104 executed by the one or more computer subsystems. In some embodiments, the system includes an inspection subsystem coupled to the one or more computer subsystems. For example, in FIG. 1, the system includes inspection subsystem 100 coupled to computer subsystems(s) 102. In the embodiments shown in FIG. 1, the inspection subsystem is configured as a light-based inspection subsystem. However, in other embodiments described herein, the inspection subsystem is configured as an electron beam or charged particle beam inspection subsystem.

The inspection subsystem is configured to generate images of a specimen. In general, the inspection subsystems described herein include at least an energy source, a detector, and a scanning subsystem. The energy source is configured to generate energy that is directed to a specimen by the inspection subsystem. The detector is configured to detect energy from the specimen and to generate output responsive to the detected energy. The scanning subsystem is configured to change a position on the specimen to which the energy is directed and from which the energy is detected.

In a light-based inspection subsystem, the energy directed to the specimen includes light, and the energy detected from the specimen includes light. In the embodiment of the system shown in FIG. 1, the inspection subsystem includes an illumination subsystem configured to direct light to specimen 14. The illumination subsystem includes at least one light source, e.g., as shown in FIG. 1, light source 16. The illumination subsystem may be configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen and the defects to be detected on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 16, optical element 18, and lens 20 such that the light is directed to the specimen at a different oblique angle of incidence or a normal (or near normal) angle of incidence.

In some instances, the inspection subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example in some instances, optical element 18 may be configured as a spectral filter and the properties of the spectral filter can be changed in a variety of different ways (e.g., by swapping out one spectral filter with another) such that different wavelengths of light can be directed to the specimen at different times. The illumination subsystem may have any other suitable configuration known in the art for directing the light having different or the same characteristics to the specimen at different or the same angles of incidence sequentially or simultaneously.

Light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength(s) known in the art. The laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection subsystem also includes a scanning subsystem configured to change the position on the specimen to which the light is directed and from which the light is detected and possibly to cause the light to be scanned over the specimen. For example, the inspection subsystem may include stage 22 on which specimen 14 is disposed during inspection. The scanning subsystem may include any suitable mechanical and/or robotic assembly (that includes stage 22) that can be configured to move the specimen such that the light can be directed to and detected from different positions on the specimen. In addition, or alternatively, the inspection subsystem may be configured such that one or more optical elements of the inspection subsystem perform some scanning of the light over the specimen such that the light can be directed to and detected from different positions on the specimen. In instances in which the light is scanned over the specimen, the light may be scanned over the specimen in any suitable fashion such as in a serpentine-like path or in a spiral path.

The inspection subsystem further includes one or more detection channels. At least one of the detection channel(s) includes a detector configured to detect light from the specimen due to illumination of the specimen by the subsystem and to generate output responsive to the detected light. For example, the inspection subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the inspection subsystem that includes two detection channels, the inspection subsystem may include a different number of detection channels (e.g., only one detection channel or two or more detection channels). In one such instance, the detection channel formed by collector 30, element 32, and detector 34 may form one side channel as described above, and the inspection subsystem may include an additional detection channel (not shown) formed as another side channel that is positioned on the opposite side of the plane of incidence. Therefore, the inspection subsystem may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the inspection subsystem may also include two or more side channels configured as described above. As such, the inspection subsystem may include at least three channels (i.e., one top channel and two side channels), and each of the at least three channels has its own collector, each of which is configured to collect light at different scattering angles than each of the other collectors.

As described further above, each of the detection channels included in the inspection subsystem may be configured to detect scattered light. Therefore, the inspection subsystem shown in FIG. 1 may be configured for dark field (DF) inspection of specimens. However, the inspection subsystem may also or alternatively include detection channel(s) that are configured for bright field (BF) inspection of specimens. In other words, the inspection subsystem may include at least one detection channel that is configured to detect light specularly reflected from the specimen. Therefore, the inspection subsystems described herein may be configured for only DF, only BF, or both DF and BF inspection. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 36 of the inspection subsystem may be configured to generate images of the specimen from the non-imaging output of the detectors. However, in other instances, the detectors may be configured as imaging detectors that are configured to generate imaging signals or image data. Therefore, the inspection subsystem may be configured to generate images in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection system) such as the 29xx/39xx series of tools that are commercially available from KLA Corp., Milpitas, Calif. For some such systems, the methods described herein may be provided as optional functionality of the inspection system (e.g., in addition to other functionality of the inspection system). Alternatively, the inspection subsystem described herein may be designed "from scratch" to provide a completely new inspection system.

Computer subsystem 36 may be coupled to the detectors of the inspection subsystem in any suitable manner (e.g., via one or more transmission media, which may include "wired" and/or "wireless" transmission media) such that the computer subsystem can receive the output generated by the detectors. Computer subsystem 36 may be configured to perform a number of functions using the output of the detectors. For instance, the computer subsystem may be configured to detect events on the specimen using the output of the detectors. Detecting the events on the specimen may be performed by applying some defect detection algorithm and/or method to the output generated by the detectors, which may include any suitable algorithm and/or method known in the art. For example, the computer subsystem may compare the output of the detectors to a threshold. Any output having values above the threshold may be identified as an event (e.g., a potential defect) while any output having values below the threshold may not be identified as an event.

The computer subsystem of the inspection system may be further configured as described herein. For example, computer subsystem 36 may be part of the one or more computer subsystems described herein or may be configured as the one or more computer subsystems described herein. In particular, computer subsystem 36 may be configured to perform the steps described herein. As such, the steps described herein may be performed "on-tool," by a computer system or subsystem that is part of an inspection system.

The computer subsystem of the inspection system (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems. For example, computer subsystem 36 may be coupled to computer subsystems(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the inspection subsystem is described above as being an optical or light-based inspection subsystem, in another embodiment, the inspection subsystem is configured as an electron beam inspection subsystem. In an electron beam inspection subsystem, the energy directed to the specimen includes electrons, and the energy detected from the specimen includes electrons. In one such embodiment shown in FIG. 1a, the inspection subsystem includes electron column 122, and the system includes computer subsystem 124 coupled to the inspection subsystem. Computer subsystem 124 may be configured as described above. In addition, such an inspection subsystem may be coupled to another one or more computer subsystems in the same manner described above and shown in FIG. 1.

Figure 1A:
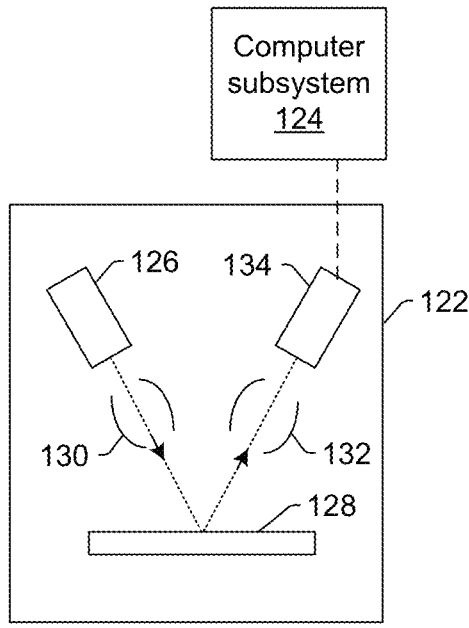

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, the electron beam may be directed to and scattered from the specimen at any suitable angles. In addition, the electron beam inspection subsystem may be configured to use multiple modes to generate output for the specimen as described further herein (e.g., with different illumination angles, collection angles, etc.). The multiple modes of the electron beam inspection subsystem may be different in any output generation parameters of the inspection subsystem.

Computer subsystem 124 may be coupled to detector 134 as described above. The detector may detect electrons returned from the surface of the specimen thereby forming electron beam images of (or other output for) the specimen. The electron beam images may include any suitable electron beam images. Computer subsystem 124 may be configured to detect events on the specimen using output generated by detector 134, which may be performed as described above or in any other suitable manner. Computer subsystem 124 may be configured to perform any additional step(s) described herein. A system that includes the inspection subsystem shown in FIG. 1a may be further configured as described herein.

It is noted that FIG. 1a is provided herein to generally illustrate a configuration of an electron beam inspection subsystem that may be included in the embodiments described herein. As with the optical inspection subsystem described above, the electron beam inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection system) such as the tools that are commercially available from KLA. For some such systems, the methods described herein may be provided as optional functionality of the system (e.g., in addition to other functionality of the system). Alternatively, the system described herein may be designed "from scratch" to provide a completely new system.

Although the inspection subsystem is described above as being a light or electron beam inspection subsystem, the inspection subsystem may be an ion beam inspection subsystem. Such an inspection subsystem may be configured as shown in FIG. 1a except that the electron beam source may be replaced with any suitable ion beam source known in the art. In addition, the inspection subsystem may include any other suitable ion beam imaging system such as those included in commercially available focused ion beam (FIB) systems, helium ion microscopy (HIM) systems, and secondary ion mass spectroscopy (SIMS) systems.

As further noted above, the inspection subsystem may be configured to have multiple modes. In general, a "mode" is defined by the values of parameters of the inspection subsystem used to generate output for the specimen. Therefore, modes that are different may be different in the values for at least one of the optical or electron beam parameters of the inspection subsystem (other than position on the specimen at which the output or images are generated). For example, for a light-based inspection subsystem, different modes may use different wavelengths of light. The modes may be different in the wavelengths of light directed to the specimen as described further herein (e.g., by using different light sources, different spectral filters, etc.) for different modes. In another embodiment, different modes may use different illumination channels. For example, as noted above, the inspection subsystem may include more than one illumination channel. As such, different illumination channels may be used for different modes.

The multiple modes may also be different in illumination and/or collection/detection. For example, as described further above, the inspection subsystem may include multiple detectors. Therefore, one of the detectors may be used for one mode and another of the detectors may be used for another mode. Furthermore, the modes may be different from each other in more than one way described herein (e.g., different modes may have one or more different illumination parameters and one or more different detection parameters). The inspection subsystem may be configured to scan the specimen with the different modes in the same scan or different scans, e.g., depending on the capability of using multiple modes to scan the specimen at the same time.

The systems described herein may be configured as another type of semiconductor-related process/quality control type system such as a defect review system and a metrology system. For example, the embodiments of the systems described herein and shown in FIGS. 1 and 1a may be modified in one or more parameters to provide different imaging capability depending on the application for which they will be used. In one embodiment, the electron beam inspection subsystem configuration described herein may be modified to be configured as an electron beam defect review system. For example, the subsystem shown in FIG. 1a may be configured to have a higher resolution if it is to be used for defect review or metrology rather than for inspection. In other words, the embodiments of the system shown in FIGS. 1 and 1a describe some general and various configurations for a subsystem that can be tailored in a number of manners that will be obvious to one skilled in the art to produce subsystems having different imaging capabilities that are more or less suitable for different applications.

As noted above, the inspection subsystems may be configured for directing energy (e.g., light, electrons) to and/or scanning energy over a physical version of the specimen thereby generating actual images for the physical version of the specimen. In this manner, the inspection subsystems may be configured as "actual" imaging systems, rather than "virtual" systems. A storage medium (not shown) and computer subsystem(s) 102 shown in FIG. 1 may be configured as a "virtual" system. Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

The one or more components executed by the one or more computer subsystems include trained machine learning (ML) model 106 shown in FIG. 1. The trained ML model is configured for transforming the images of the specimen generated by the inspection subsystem into higher resolution images of the specimen.

Figure 2:
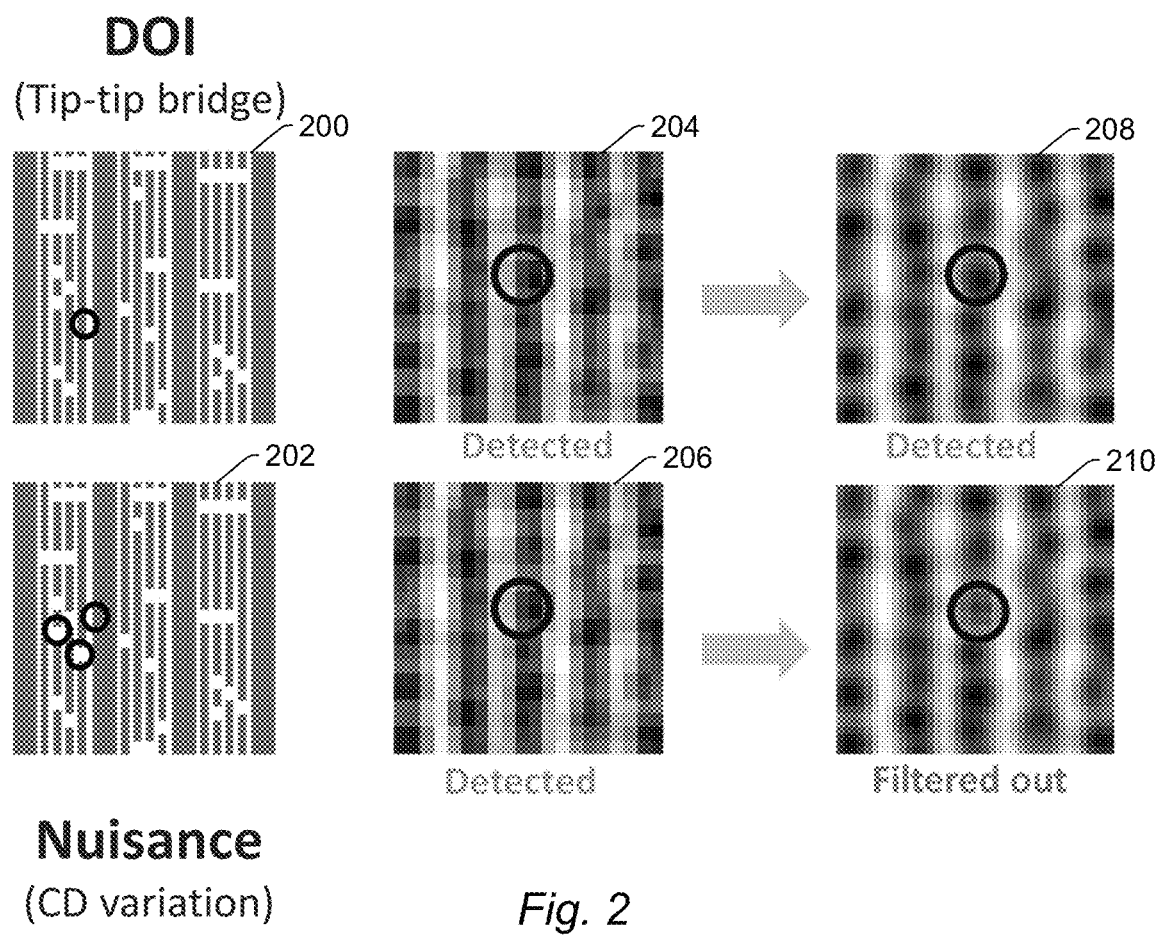
FIG. 2 is a schematic diagram illustrating plan views of examples of locations of a defect of interest (DOI) and nuisances in a design for a specimen, low resolution images for the DOI and the nuisances on a specimen, and high resolution images for the DOI and nuisances on the specimen.

FIG. 2 generally illustrates some examples of design data, inspection specimen images, and higher resolution images that illustrate how the trained ML model can be useful. In particular, design image 200 shown in FIG. 2 shows a portion of design data for a specimen and a location (within the circle overlaid on the design image) at which a DOI such as a tip-tip bridge may be located. Design image 202 shows the same portion of the design data and locations (within the circles overlaid on design image 202) at which nuisances such as CD variation may be located.

Image 204 illustrates one possible image that may be generated for a specimen by an inspection subsystem in which a tip-tip bridge type DOI may be detected at the location in the circle overlaid on the image. Image 206 illustrates one possible image that may be generated for the specimen by the inspection subsystem in which a CD variation type nuisance may be detected at the location in the circle overlaid on the image. As can be seen by comparing the circled portions of images 204 and 206, the DOI and the nuisance have substantially similar signal characteristics in both images, which renders the separation of the DOI from the nuisance difficult. In particular, when the DOI and nuisances have substantially similar signal characteristics, it may be practically impossible to detect the DOI without also detecting the nuisances and to determine which of the detected events are DOIs and which are nuisances without additional information.

However, both images may be input to the trained ML model as described herein and thereby transformed into higher resolution images. For example, the trained ML model may transform image 204 into higher resolution image 208 of the specimen and image 206 into higher resolution image 210 of the specimen. As can be seen by comparing the circled portions of images 208 and 210, which correspond to the circled portions of images 204 and 206, respectively, the DOI has a much different signal in image 208 than the nuisance in image 210. In this manner, the signals for DOIs and nuisances in the higher resolution images generated by the trained ML model may have enough separation that the DOI can remain detected while the nuisance is filtered out. As described further herein, the inventors have found that using the higher resolution images generated by the trained ML model from the images generated by the inspection subsystem can reduce the number of nuisances in inspection results by as much as 50×, which has significant benefits for inspection and other related processes like defect review.

Each of the design images, test images, reference images, lower resolution images, actual higher resolution images, simulated higher resolution images, etc. shown in the figures is not meant to illustrate any particular specimen(s) or characteristics thereof for which the embodiments described herein may be used. In a similar manner, each of the lower and higher resolution images shown in the figures is not meant to illustrate any particular actual or simulated images that may be generated for specimen(s). Instead, the design images, test images, reference images, lower resolution images, actual higher resolution images, simulated higher resolution images, etc. shown in the figures are merely intended to promote understanding of the embodiments described herein. The images actually input and output from the trained ML model will vary depending on the specimen and its characteristics, which are related to its design, and the configuration of the imaging system that generates the actual images for the specimen(s), which are used to train the ML model thereby affecting the simulated images that are generated by the trained ML model.

The embodiments described herein are configured to perform two training phases. The first phase is pre-training using only simulated data from design. For example, the one or more computer subsystems are configured for pre-training an initial ML model with a pre-training set thereby generating a pre-trained ML model. The pre-training set includes simulated inspection images of a test specimen designated as pre-training inputs and corresponding simulated higher resolution images of the test specimen designated as pre-training outputs. In the pre-training phase, the simulated inspection images may include simulated test images (possibly with simulated defects and/or other variations such as LER) and possibly corresponding simulated reference images (e.g., defect-free specimen images). The design for the specimen may also be used as a pre-training input in the pre-training phase. The simulated higher resolution images used in the pre-training phase may be higher resolution images that may include the simulated defects and other variations like LER. In the pre-training phase, the initial ML model may use the pre-training inputs and outputs to learn the transformations from the pre-training inputs to the pre-training outputs.

Figure 3:
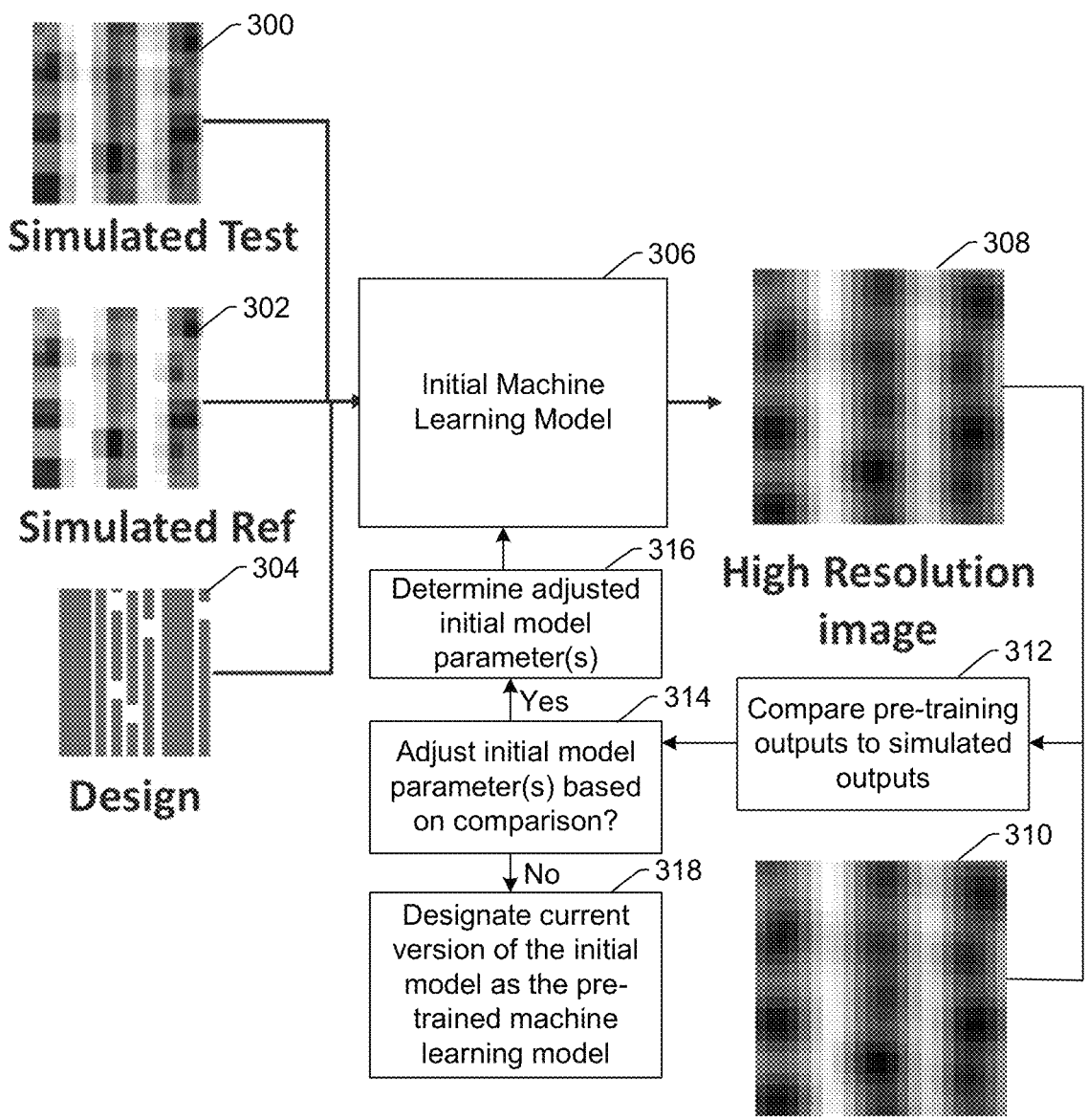
FIG. 3 is a flow chart illustrating one embodiment of steps that may be performed for pre-training an initial machine learning (ML) model.

FIG. 3 shows one such embodiment of pre-training for an improved resolution network. In this embodiment, simulated inspection test image 300, simulated inspection reference image 302, and design 304 for a test specimen are used as pre-training inputs to initial ML model 306. In the pre-training phase, simulated higher resolution image 310 is used as the pre-training output. In this manner, when the pre-training inputs are input to the initial ML model, the ML model will output higher resolution image 308. In step 312, the one or more computer subsystems compare the pre-training outputs (i.e., simulated higher resolution image 310) to the simulated outputs (i.e., high resolution image 308). As shown in step 314, the one or more computer subsystems may determine if one or more initial model parameter(s) should be adjusted based on the comparison. If it is determined that one or more initial model parameter(s) should be adjusted, the one or more computer subsystems may determine adjusted initial model parameters, as shown in step 316, which may be determined based on any differences between the pre-training outputs and the simulated outputs. The determined one or more initial model parameter(s) may then be applied to initial ML model. If it is determined that one or more initial model parameter(s) do not need to be adjusted, then the one or more computer subsystems may designate the current version of the initial ML model as the pre-trained ML model, as shown in step 318.

In this manner, the steps shown in FIG. 3 may be performed in a kind of feedback loop until the initial ML model generates output that substantially matches the pre-training outputs. In other words, the pre-training may include inputting the pre-training inputs into the initial ML model and altering one or more parameters of the initial ML model until the output produced by the initial ML model matches (or substantially matches) the pre-training outputs. Pre-training may include altering any one or more trainable parameters of the initial ML model. For example, the one or more parameters of the initial ML model that are trained by the embodiments described herein may include one or more weights for any layer of the initial ML model that has trainable weights. In one such example, the weights may include weights for convolution layers but not pooling layers. The steps shown in FIG. 3 may be performed offline during a setup phase of the inspection.

The pre-training phase therefore may be performed using only simulated pre-training inputs and outputs, which is one new feature of the embodiments described herein. In other words, none of the images used for the pre-training phase are actual (i.e., non-simulated) images of a specimen generated using the physical version of the specimen itself and some imaging hardware. One advantage of the embodiments described herein is therefore that pre-training the network with simulated optical (or other) images reduces the tool time required to acquire optical or other lower resolution inspection images and high resolution images (e.g., scanning electron microscope (SEM) images).

In one embodiment, the initial ML model is a generative network. A "generative" network can be generally defined as a model that is probabilistic in nature. In other words, a "generative" network is not one that performs forward simulation or rule-based approaches and, as such, a model of the physics of the processes involved in generating an actual image is not necessary. Instead, as described further herein, the generative network can be learned (in that its parameters can be learned) based on a suitable training set of data. The generative network may be configured to have a deep learning (DL) architecture, which may include multiple layers that perform a number of algorithms or transformations. The number of layers included in the generative network may be use case dependent. For practical purposes, a suitable range of layers is from 2 layers to a few tens of layers. Deep generative networks that learn the joint probability distribution (mean and variance) between the lower resolution, inspection type specimen images (e.g., images of an actual wafer) and higher resolution specimen images (e.g., SEM or defect review type images) can be configured as described further herein.

In another embodiment, the initial ML model is a generative adversarial network (GAN). In general, GANs consist of two adversarial models, a generative model, G, capturing the data distribution, and a discriminative model, D, estimating the probability that a given sample comes from the training data rather than G. G and D could be a multi-layer perceptron, i.e. a non-linear mapping function. The generator builds a mapping function from a prior noise distribution $p_z(z)$ to the data space $G(z; \theta_g)$ in order to learn a generator distribution $p_g$ over the data x where G is a differentiable function represented by a multilayer perceptron with parameters $\theta_g$. The generator is trained to produce images that cannot be distinguished from real images. The adversarially trained discriminator is trained to detect fakes which are created by the generator. Both the generator and the discriminator are trained as good as possible so that the generator produces extremely good "faked" images. For example, the generator outputs synthetic samples given a random noise variable input z. Over time, the generator gets trained to capture the real data distribution by having the discriminator reject images which it considers as being bad fakes.

Additional description of the general architecture and configuration of GANs can be found in "Generative Adversarial Nets" Goodfellow et al., arXiv:1406.2661, Jun. 10, 2014, 9 pages, "Semi-supervised Learning with Deep Generative Models," Kingma et al., NIPS 2014, Oct. 31, 2014, pp. 1-9, "Conditional Generative Adversarial Nets," Mirza et al., arXiv:1411.1784, Nov. 6, 2014, 7 pages, "Adversarial Autoencoders," Makhzani et al., arXiv:1511.05644v2, May 25, 2016, 16 pages, and "Image-to-Image Translation with Conditional Adversarial Networks," by Isola et al., arXiv: 1611.07004v2, Nov. 22, 2017, 17 pages, which are incorporated by reference as if fully set forth herein. The embodiments described herein may be further configured as described in these references.

In a further embodiment, the initial ML model is an autoencoder. An autoencoder, autoassociator or Diabolo network is an artificial neural network used for unsupervised learning of efficient codings. The aim of an autoencoder is to learn a representation (encoding) for a set of data, typically for the purpose of dimensionality reduction. Recently, the autoencoder concept has become more widely used for learning generative models of data. Architecturally, the simplest form of an autoencoder is a feedforward, non-recurrent neural network very similar to the multilayer perceptron (MLP)—having an input layer, an output layer and one or more hidden layers connecting them—, but with the output layer having the same number of nodes as the input layer, and with the purpose of reconstructing its own inputs (instead of predicting the target value given inputs). Therefore, autoencoders are unsupervised learning models. An autoencoder always consists of two parts, the encoder and the decoder. Various techniques exist to prevent autoencoders from learning the identity function and to improve their ability to capture important information and learn richer representations. The autoencoder may include any suitable variant of autoencoder such as a Denoising autoencoder, sparse autoencoder, variational autoencoder, and contractive autoencoder.

A variational auto-encoder is a component that takes the merits of DL and variational inference and leads to significant advances in generative modeling. In addition or alternatively, a variational autoencoder (VAE) combined with a GAN or a deep generative adversarial network (DGAN)) may be configured as described in "Adversarial Autoencoders," Makhzani et al., arXiv:1511.05644v2, May 25, 2016, 16 pages, which is incorporated by reference as if fully set forth herein. The embodiments described herein may be further configured as described in this reference.

In one embodiment, the one or more computer subsystems are configured for generating the simulated inspection images and the simulated higher resolution images from a design for the test specimen. For example, the computer subsystem(s) may be configured for extracting design clips at random locations across a reticle. The simulated data may be generated in pairs at two resolutions. The first matches the data acquired by the inspection tool. The second is at the target improved resolution. Many such pairs can be simulated to pre-train the generative network without requiring the expensive paired actual specimen images (e.g., optical and SEM data), including in some cases where a SEM may be the only available source of higher resolution imaging.

In one such embodiment, generating the simulated inspection images and the simulated higher resolution images includes simulating process variations to the design formed on the test specimen by applying perturbations to the design representative of expected process variations thereby generating a perturbed design. In this manner, the computer subsystem(s) may be configured for simulating process variations as perturbations to the design. One new feature of the embodiments described herein is therefore that they may perform pre-training using image simulation from perturbed design. The process variation simulation may be performed to simulate variations in one or more characteristics of the design printed on the specimen such as LER variations from design, CD variations from design, etc.

The process variations may be simulated for only the nominal perturbations that would happen to the design formed on the specimen. In this manner, the perturbed design may represent how the design would look on the specimen if it was formed with the best possible or nominal process parameters (i.e., if the process was functioning as normal). However, the perturbed design may also or alternatively be generated for non-nominal process variations to simulate how the design would be formed on the specimen with other or non-nominal process parameters, which may be within or even beyond a known or expected process window for the process(es) used to form the design on the specimen. In this manner, the perturbations may be applied to the design to generate images representing how the design would be formed on the specimen at one or more process parameters thereby generating one or more perturbed designs. Applying the perturbations in this manner may therefore simulate images that might be generated by a process window qualification (PWQ) type process or by forming and imaging a focus-exposure matrix (FEM) type wafer. Examples of PWQ methods are described in U.S. Pat. No. 6,902,855 to Peterson et al. issued on Jun. 7, 2005, U.S. Pat. No. 7,418,124 to Peterson et al. issued on Aug. 26, 2008, U.S. Pat. No. 7,729,529 to Wu et al. issued on Jun. 1, 2010, U.S. Pat. No. 7,769,225 to Kekare et al. issued on Aug. 3, 2010, U.S. Pat. No. 8,041,106 to Pak et al. issued on Oct. 18, 2011, U.S. Pat. No. 8,111,900 to Wu et al. issued on Feb. 7, 2012, and U.S. Pat. No. 8,213,704 to Peterson et al. issued on Jul. 3, 2012, which are incorporated by reference as if fully set forth herein. The embodiments described herein may include any step(s) of any method(s) described in these patents and may be further configured as described in these patents, except that unlike some of the methods and systems described in these patents, the embodiments described herein may simulate a PWQ or FEM wafer by applying different perturbations to the design rather than printing a design on a physical wafer with different process parameters.

Figure 4:
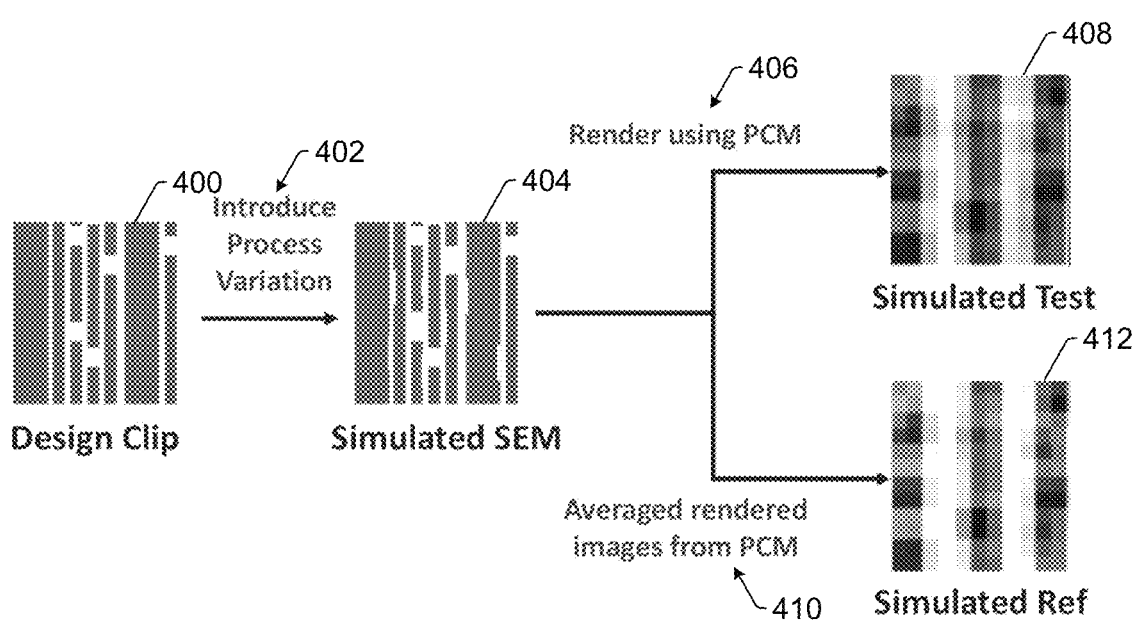
FIG. 4 is a flow chart illustrating one embodiment of steps that may be performed for generating simulated inspection images and simulated higher resolution images for a pre-training set.

FIG. 4 illustrates one embodiment of offline pre-training data generation using simulation. As shown in step 400, the one or more computer subsystems may extract design clips 400 as described above. Extracting the design clips may be performed in any suitable manner from any of the design, design data, or design information described herein. The design clips may have any suitable size and may be selected in any suitable manner. Although only one design clip is shown in FIG. 4 for clarity, the embodiments described herein will generally extract many more than one design clip and the number of extracted design clips may be determined based on the number of simulated pre-training data expected to be needed for the pre-training phase. The pattern shown in design clip 400 is not meant to illustrate any particular design or specimen for which the embodiments described herein can be used. In other words, the embodiments described herein are not design or specimen specific.

As shown in step 402, the one or more computer subsystems may introduce process variations to the design clips. In some such embodiments, applying the perturbations to the design is performed with a Gaussian process model. For example, the perturbations may be representative of the actual variations and may be achieved by a Gaussian process model. The Gaussian process model may include any such suitable model known in the art. In addition, although a Gaussian process model may be particularly suitable for applying the perturbations in the embodiments described herein, any other suitable process model may be used for this step (e.g., when a different process model can better estimate the perturbations that happen to the design when it is formed on the specimen). The perturbed design may be suitable for use as the simulated higher resolution images. For example, as shown in FIG. 4, the output of the introduce process variation step 402 may be simulated SEM image 404.

In another embodiment, generating the simulated inspection images also includes transforming the perturbed design into an image domain. For example, perturbing the design may generate a binary version of the original design that as described above may be suitable for use as a simulated higher resolution image (e.g., simulated SEM image 404). Therefore, such a binary version of the original design is still not representative of an image that would be generated by an imaging tool. In some instances, the binary version of the perturbed design may be transformed into a gray scale image that more accurately represents an image that would be generated by an imaging tool. In this manner, the perturbed design may be transformed from the design domain into the image domain of a higher resolution imaging tool.

In a similar manner, the perturbed design may be transformed into the image domain of a lower resolution imaging tool. As described further herein, this transformation into the image domain of a lower resolution imaging tool is not as simple as transforming a binary image to a gray scale image because the lower resolution imaging tool may generate images that look nothing like the design and perturbed design (e.g., as can be seen by the differences between design clip 400, simulated SEM image 404, simulated test image 408, and simulated reference image 412 shown in FIG. 4).

In a further embodiment, transforming the perturbed design into the image domain is performed with a Partial Coherence Model. For example, the perturbed design may be transformed into the optical domain using the Partial Coherence Model (PCM). In one such example, as shown in FIG. 4, the perturbed design such as simulated SEM image 404 may be input to render using PCM performed in step 406. The render using PCM step may generate simulated test image 408, which may be a simulated inspection test image. The one or more computer subsystems may also be configured to average rendered images from PCM as shown in step 410 to generate simulated reference image 412. Averaging the rendered images from PCM may be performed in any suitable manner known in the art and may be performed using multiple simulated test images to better simulate what a defect-free reference image might look like. The pre-training may then be performed offline as described further herein in a setup phase using the design and results of the PCM and LER simulation.

The PCM may have any suitable configuration and parameters known in the art. In general, a PCM may be particularly suitable for approximating optical systems such as those described herein. However, if a different model more suitably approximates (simulates) the imaging tool used to generate the inspection images, that model may be used for transforming the perturbed design into the image domain. For example, a PCM model may be a suitable model for some optical imaging tools but not all optical imaging tools. In addition, a PCM model may not be suitable for approximating an electron beam imaging tool. However, depending on the configuration of the imaging tool, a user can select, configure, or adapt an appropriate model for transforming the perturbed design into the image domain.

In some instances, the perturbed design (whether in its binary form or transformed into a gray scale image) may not be suitable for use as the simulated higher resolution images of the test specimen. In such situations, a PCM model or a different model may be applied to the perturbed design to transform the perturbed design into the image domain of the higher resolution imaging tool. If the simulated higher resolution images are generated in this manner, the models used for transforming the perturbed design into the simulated higher resolution images and the simulated lower resolution images may be the same type of model but with different parameters so that different models approximate the different imaging tools or different imaging resolutions of the same tool. However, different types of models may be used for transforming the perturbed design into different image domains, whether that is the same type of images at different resolutions or different types of images at different resolutions. For example, the perturbed design may be transformed into the simulated lower resolution images using a PCM model, and the perturbed design may be transformed into the simulated higher resolution images using a non-PCM model.

The second training phase performed by the embodiments described herein may be re-training with limited actual or non-simulated specimen images, e.g., relatively limited optical and SEM tool data. For example, the one or more computer subsystems are configured for re-training the pre-trained ML model with a training set thereby generating the trained ML model. The training set includes images generated for the test specimen by the inspection subsystem designated as training inputs and corresponding higher resolution images of the test specimen generated by a high resolution imaging system designated as training outputs. In this manner, the embodiments described herein can improve the model performance for the inspected specimen layer by re-training with the acquired low resolution specimen images, the paired higher resolution specimen images (e.g., SEM images), and design data. The SEM tool data may be the higher resolution ground truth data.

In the re-training phase, which may also be referred to in the art simply as the training phase, the training inputs may include test and reference images generated for the test specimen by the inspection subsystem. In some embodiments, the training set includes a design for the specimen. For example, the training inputs may also optionally include the design for the test specimen. The training outputs may include higher resolution images such as those generated by a SEM. In the training phase, the pre-trained ML model may learn the transformations from the lower resolution training inputs to the higher resolution training outputs. In this manner, the training phase may utilize a limited amount of actual tool data and inference. As described further herein, the trained ML model may then be used during inspection to predict higher resolution images from inspection images.

In one embodiment, a number of the images in the training set is less than a number of the simulated inspection images in the pre-training set, and a number of the higher resolution images in the training set is less than a number of the simulated higher resolution images in the pre-training set. For example, an additional advantage of the embodiments described herein is that pre-training the network as described herein minimizes the requirement on the number of paired training inputs and outputs (e.g., optical and high resolution SEM images) needed for the training.

Figure 5:
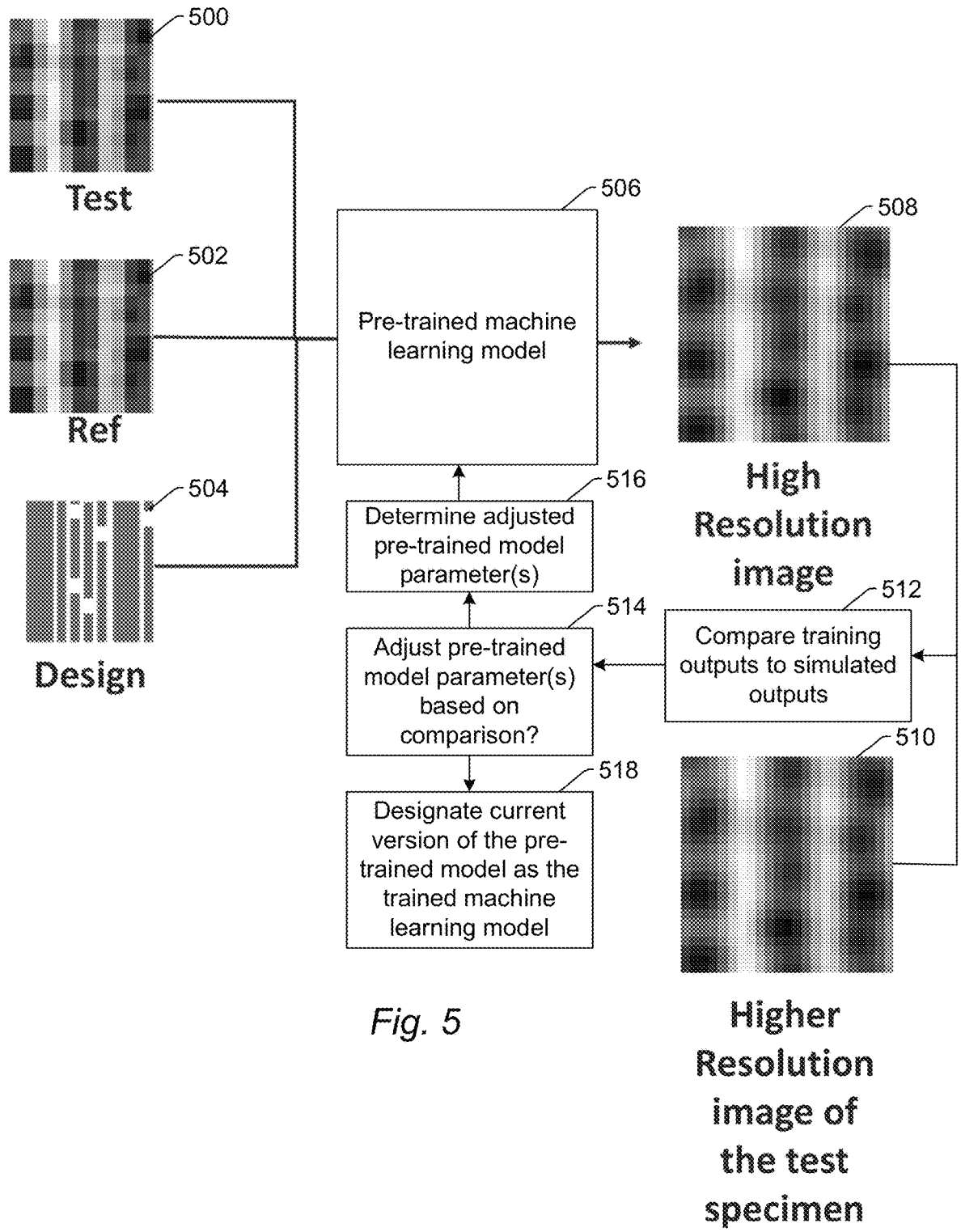
FIG. 5 is a flow chart illustrating one embodiment of steps that may be performed for re-training the pre-trained ML model.

FIG. 5 shows one embodiment for re-training with limited tool data. In this embodiment, actual inspection test image 500, actual inspection reference image 502, and design 504 for a test specimen are used as training inputs to pre-trained ML model 506. In the training phase, higher resolution image of the test specimen 510 is used as the training output. In this manner, when the training inputs are input to the pre-trained ML model, the pre-trained ML model will output higher resolution image 508. In step 512, the one or more computer subsystems compare the training outputs (i.e., higher resolution image of the test specimen 510) to the simulated outputs (i.e., higher resolution image 508). As shown in step 514, the one or more computer subsystems may determine if one or more pre-trained ML model parameter(s) should be adjusted based on the comparison. If it is determined that one or more pre-trained ML model parameter(s) should be adjusted, the one or more computer subsystems may determine adjusted pre-trained ML model parameters, as shown in step 516, which may be determined based on any differences between the training outputs and the simulated outputs. The determined one or more pre-trained ML model parameter(s) may then be applied to pre-trained ML model. If it is determined that one or more pre-trained ML model parameter(s) do not need to be adjusted, then the one or more computer subsystems may designate the current version of the pre-trained ML model as the trained ML model, as shown in step 518.

In this manner, the steps shown in FIG. 5 may be performed in a kind of feedback loop until the pre-trained ML model generates output that substantially matches the training outputs. In other words, the training may include inputting the training inputs into the pre-trained ML model and altering one or more parameters of the pre-trained ML model until the output produced by the pre-trained ML model matches (or substantially matches) the training outputs. Training may include altering any one or more trainable parameters of the pre-trained ML model. For example, the one or more parameters of the pre-trained ML model that are trained by the embodiments described herein may include one or more weights for any layer of the pre-trained ML model that has trainable weights. In one such example, the weights may include weights for convolution layers but not pooling layers. The steps shown in FIG. 5 may be performed offline during a setup phase of the inspection.

In another embodiment, the simulated inspection images, simulated higher resolution images, images generated for the test specimen, and higher resolution images of the test specimen include only optical images. For example, all of the images described herein may be optical images. Such an embodiment may be suitable when the inspection subsystem is configured as a light-based tool (e.g., as shown in FIG. 1) and when the simulated higher resolution images are meant to simulate images that would be generated by a higher resolution optical tool (whether that is an inspection subsystem operating in a higher resolution mode or another tool such as a metrology or defect review tool configured for light-based imaging).

In an additional embodiment, the simulated inspection images and images generated for the test specimen include only optical images, and the simulated higher resolution images and higher resolution images of the test specimen include only electron beam images. In this manner, some of the images described herein may be optical images and others may be electron beam images. This situation may be the most common use of the embodiments described herein. For example, the embodiments described herein may be particularly suitable for use with a light-based inspection subsystem such as that shown in FIG. 1, which can advantageously be used to scan a specimen with substantially high throughput at a lower resolution. For such inspections, the events or defects detected by the inspection are often imaged with a higher resolution electron beam tool (which may be configured as shown in FIG. 1*a*) such as a SEM defect review tool. Therefore, one popular way to configure and use the embodiments described herein might be to train and use the ML model with lower resolution, optical inspection images as the inputs and higher resolution, electron beam defect review type images as the outputs. In this manner, the ML model may be trained and then used to generate higher resolution SEM type images from lower resolution optical inspector type images.

In a further embodiment, the simulated inspection images, simulated higher resolution images, images generated for the test specimen, and higher resolution images of the test specimen include only electron beam images. For example, all of the images described herein may be electron beam images. Such an embodiment may be suitable when the inspection subsystem is configured as an electron beam-based tool (e.g., as shown in FIG. 1*a*) and when the simulated higher resolution images are meant to simulate images that would be generated by a higher resolution electron beam tool (whether that is an inspection subsystem operating in a higher resolution mode or another tool such as a metrology or defect review tool configured for electron beam-based imaging).

Although the embodiments described herein are described with respect to a trained ML model, the embodiments are not limited to a single trained ML model. For example, different ML models may be trained as described herein to produce images or other output for different modes. In particular, in most cases, different modes of an inspection or other imaging tool will produce images and/or output that are different from each other in one of several possible ways, e.g., noise levels, contrast, resolution, image type (e.g., DF vs. BF, optical vs. electron beam, etc.), and the like. Therefore, if a ML model is trained to produce simulated higher resolution images for a high resolution mode of a tool from lower resolution images generated from a low resolution mode of the tool or a different tool, chances are it will be unsuitably trained to produce higher resolution images for another high resolution mode of the tool or from lower resolution images generated from another low resolution mode of the tool or different tool. As such, multiple ML models may be separately and independently trained, one for each mode combination of interest. For example, a first ML model may be trained as described herein to generate higher resolution SEM images that would be generated by one mode of a SEM from lower resolution images generated from a first mode of an inspection tool, and a second ML model may be trained as described herein to generate higher resolution SEM images that would be generated by the same or different mode of the SEM from lower resolution images generated from a second mode of the inspection tool. The same initial ML model may however be used for each mode although that is not necessary. Each trained ML model may then be used to generate a mode specific data set.

The test specimen used for generating the pre-training set and the training set may be different than the one for which higher resolution images are generated by the trained ML model. In addition, although the pre-training set and training set are described herein with respect to a test specimen, more than one test specimen may be used for generating the pre-training set and the training set. In general, however, since the pre-training set includes only simulated images, an actual test specimen is not required for generating the pre-training set. In this manner, the pre-training and re-training sets may be generated using one or more test specimens, and the higher resolution simulated images may be generated for a "runtime" specimen. The test specimen(s) and the runtime specimen may be the same type of specimens, e.g., they may have the same design and may have been processed using the same fabrication process step(s), although as described further herein that is not necessarily always the case. In addition, the trained ML model may be used for generating simulated images for more than one runtime specimen, all of which may have the same design and may have been processed using the same fabrication process step(s).

In general, the one or more test specimens used to generate the pre-training and re-training sets used to pre-train and re-train the ML model, respectively, and the specimen for which the higher resolution images are simulated using the trained ML model may have the same design and may have been processed in the same processes (and therefore be of the same "layer"). Training the ML model in such a manner will ensure that the simulated higher resolution image(s) most closely resemble the actual higher resolution images that would be generated for the specimen. But in some cases, a test specimen may have similar enough characteristics (e.g., patterned features, materials, etc.) to a runtime specimen, that a ML model trained on the test specimen can be used to generate higher resolution simulated image(s) for the runtime specimen even if the test and runtime specimens do not have the same designs. In such cases, the higher resolution simulated image(s) that are generated by the trained ML model should be for the same imaging mode as that for which it was trained. In other words, as described further herein, a ML model that is trained for generating higher resolution simulated image(s) produced by one imaging mode may not necessarily be suitable for generating higher resolution simulated image(s) produced by another imaging mode. Therefore, if two specimens that have at least some similarities in at least a portion of their designs are or will be imaged in the same manner, one of the specimens may be used as the test specimen and the trained ML model may be used to generate higher resolution simulated image(s) for another of the specimens.

In this manner, a trained ML model may be repurposed for generating higher resolution simulated image(s) for specimens it was not necessarily trained for. In one such example, if two different specimens with two different designs have at least some patterned features in common in a portion of the design (e.g., similar memory array areas) formed of similar materials and having the same or similar dimensions, a ML model trained for one of the specimens may be capable of producing higher resolution simulated image(s) of that portion of the design for another of the specimens. Even if a ML model trained for one specimen is not capable of producing higher resolution simulated image(s) for another specimen having a different design, if there are some similarities among the specimens, the trained ML model may be used as starting configuration that is re-trained for another specimen to create a different trained ML model. Such re-training may be performed as described herein.

The one or more computer subsystems are configured for inputting the images to generated for the specimen by the inspection subsystem during inspection into the trained ML model to thereby generate the higher resolution images of the specimen. In this manner, the trained ML model is used to improve the resolution of the input (e.g., optical image) at candidate defect locations. One further advantage of the embodiments described herein is therefore that the embodiments can generate the higher resolution images with no throughput impact as no additional specimen scans are needed. In addition, the embodiments described herein enable inspections to be run at a larger pixel size but with the advantages of a smaller pixel size (since the higher resolution images can be generated using a trained ML model described herein from inspection images generated at a much lower resolution, i.e., a larger pixel size). Enabling a lower resolution inspection while retaining the advantages of a higher resolution inspection can also have a significant improvement on throughput (e.g., a greater than 3× throughput improvement). The trained ML based model may also be used to generate higher resolution images for the specimen in real time during on tool inspection. In this manner, higher resolution images may be generated for the specimen from inspection images online during runtime.

The computer subsystem(s) may be configured to input the images generated for the specimen into the trained ML model in any suitable manner known in the art. Although some embodiments are described herein (only for the sake of clarity and simplicity) as generating "higher resolution images" for a specimen, the trained ML models described herein may be used to generate any number of higher resolution images for the specimen limited only by the images for the specimen input to the trained ML model. In addition, although some embodiments are described herein (again only for the sake of clarity and simplicity) as generating higher resolution images for "a specimen," the embodiments described herein are not limited to generating higher resolution images for only one specimen.

The images that are input to the trained ML model by the computer subsystem(s) may include both test and reference images for any one location on the specimen. The test and reference images may include, for example, images generated at corresponding locations in different dies on a specimen, different cells on a specimen, different reticle fields on a specimen, etc. The test images may also include images of the specimen generated by the inspection subsystem, and the reference images may include corresponding portions of a standard reference image stored in a computer-readable medium. The standard reference image may or may not have been generated by imaging an actual specimen.

Although inputting test and reference images for a location on the specimen into the trained ML model may improve the quality of the higher resolution image generated for the location by the trained ML model, that is not necessary. For example, any specimen images generated by the inspection subsystem during inspection may be input to the trained ML model one-by-one, and the higher resolution images generated for each location may then be used for defect detection. In this manner, the inspection process that is performed for the specimen may not include defect detection performed on the specimen images that are generated by scanning the specimen during inspection, but may include defect detection performed using the higher resolution images generated from the lower resolution images generated by the scanning. Whether or not this is a practical solution for inspection may depend on the computing needed to generate the higher resolution images and the speed with which the higher resolution images can be generated. The defect detection that is performed using the higher resolution images may include standard die-to-die defect detection or die-to-database detection where the reference image is a stored higher resolution reference image. In other words, the simulated higher resolution images may be input to any suitable defect detection method or algorithm as is currently performed in the art. However, such higher resolution images may also be suitable for single image detection such as that described in U.S. Pat. No. 10,186,026 to Karsenti et al. issued Jan. 22, 2019, which is incorporated by reference as if fully set forth herein.

In one embodiment, the one or more computer subsystems are configured for inputting a design for the specimen into the trained ML model with the images generated for the specimen by the inspection subsystem during the inspection. For example, the inspection subsystem may generate the lower resolution images for a specimen at the Nyquist rate of the system. In such situations, no new information may be obtained from the lower resolution images alone. Any super-resolution technique tries to recreate information that was lost in the imaging process and can produce artifacts. The idea to add design and simulate the process variations is to add information to the system and the ML model learn what a real perturbation looks like and the process variation that caused it. One new feature of the embodiments described herein is therefore that they can use design as an added channel to aid in the reconstruction of higher resolution images. In addition, one advantage of the embodiments described herein is that they may use aligned design information which is readily available on many currently used optical inspection tools, which adds an additional channel of information to the high resolution reconstruction method.

Figure 6:
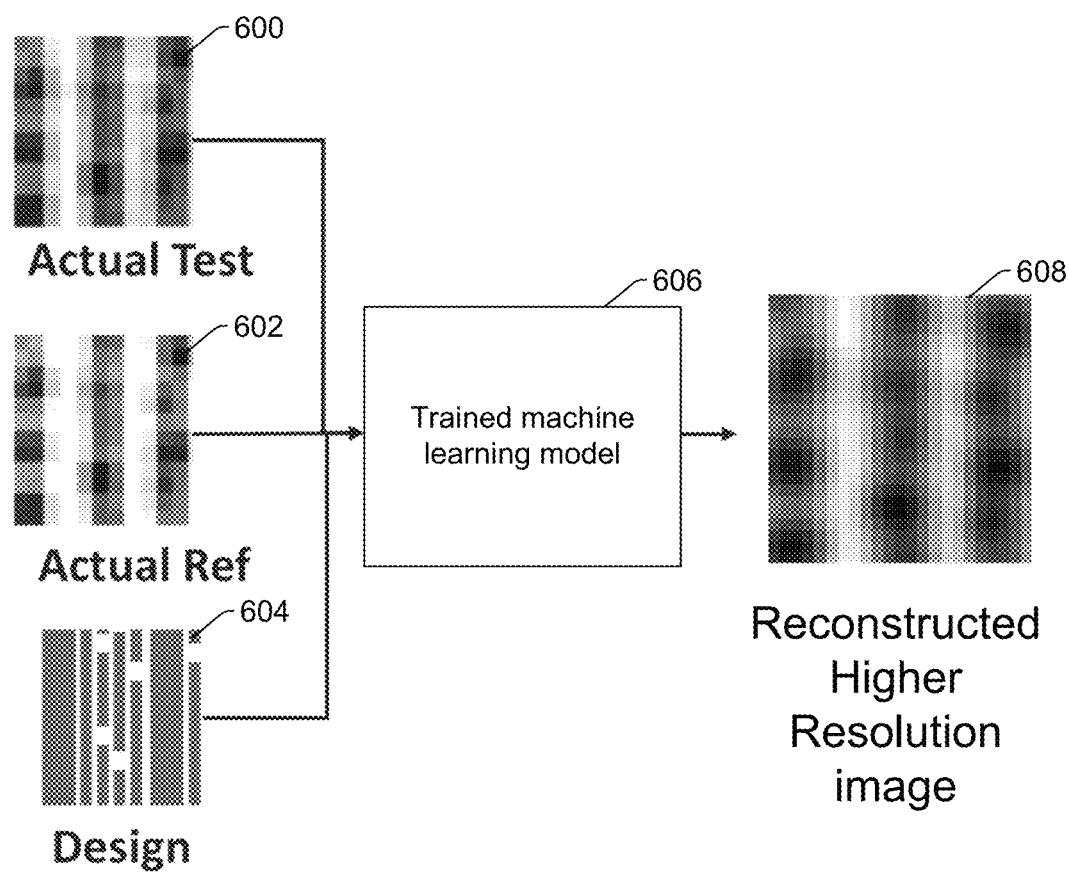
FIG. 6 is a flow chart illustrating one embodiment of a trained ML model during runtime use.

FIG. 6 shows one embodiment of inputting the images generated for the specimen by the inspection subsystem during inspection into the trained ML model to thereby generate the higher resolution images of the specimen. In this embodiment, the one or more computer subsystems input actual test image 600 for a specimen, actual reference image 602 for the specimen, and design 604 for the specimen into trained ML model 606. The trained ML model transforms the inputs into reconstructed higher resolution image 608, which may then be used for one or more additional functions described herein.

The one or more computer subsystems are configured for determining information for the specimen from the generated higher resolution images. Determining information for the specimen may include determining information for events detected on the specimen during inspection such as whether the detected events are nuisances or actual defects (as in the nuisance filtering described herein) and what the classifications of the detected events or defects not filtered by nuisance filtering are (as in the defect classification described herein).

Determining the information for the specimen may also or alternatively include performing metrology-like functions for the specimen and/or events or defects detected on the specimen. For example, the simulated higher resolution images generated by the trained ML model may be input to a metrology method or algorithm in which various characteristics of the detected events, detected defects, or patterned features (defective or not) in the simulated higher resolution images are determined or measured. Such characteristics may include any characteristics that can be determined from the higher resolution images such as CD, LER, shape characteristics, spatial relationships of defects to patterned features or patterned features relative to one another, etc.

The higher resolution images may also be more useful for align-to-design applications than the images generated by the inspection subsystem. For example, the higher resolution images may be aligned to the design for the specimen with greater accuracy and precision by an align-to-design method or algorithm such as pixel-to-design alignment (PDA) algorithms used by some tools commercially available from KLA. Therefore, the information determined for the specimen using the higher resolution images may include coordinates of defects in design data space rather than specimen space or tool specific coordinates reported by the inspection subsystem. The information about the position of the defects relative to the design determined from the simulated higher resolution images may also be used to determine additional information for the specimen such as information about weak or hot points in the design (i.e., locations where defects occur or tend to occur repeatedly in multiple instances of the same portion of the design).

In general, therefore, the simulated higher resolution images generated by a trained ML model described herein may be used as input to any method or algorithm that can be used to determine information about any of the specimens described herein from relatively high resolution images of the specimen.

In one embodiment, determining the information for the specimen from the generated higher resolution images includes performing nuisance filtering of defects detected by the inspection based on the generated higher resolution images thereby generating a filtered defect population for the specimen. In this manner, the improved higher resolution images may be used for nuisance filtering. Therefore, the embodiments described herein can help to solve the problem that going forward optical inspection is becoming nuisance limited. What that means is that, previously, there was enough separation between the signals for DOIs and nuisances that a threshold could be used to detect only DOIs and not nuisances. However, in many current situations and going forward, any threshold that can be used to detect DOIs will also necessarily detect at least some nuisances. In other words, the signals (or whatever is used for defect detection) corresponding to DOIs cannot be adequately separated from the signals for nuisances. In addition, in many instances, it is not just that a few nuisances are being detected with the DOIs. Instead, extremely high nuisance rates are becoming ever more common in which several nuisances are being detected for every one DOI or even many more nuisances are being detected than the number of DOIs. Detecting such high levels of nuisance can make the resulting data essentially useless.

Turning high nuisance rate inspection results into actionable data may, therefore, require reducing the nuisance rate by as much as 50× the current nuisance rate. For example, if a care area-based inspection produces $10^7$ total events after detection, a currently used nuisance event filter might be able to reduce that number of events by 20×, meaning that there might still be as many as 500K total events for sampling/defect review. In contrast, if the embodiments described herein can reduce the total events after detection by 1000× (meaning, a 50× improvement over current nuisance filters), the total events for sampling/review would only be 10K, a much lower number than 500K. The embodiments described herein can provide such high levels of nuisance rate reduction by using the simulated higher resolution images and leveraging design and optical simulation. The nuisance filtering may be performed in any suitable manner known in the art. For example, simply by using currently used nuisance filters with the simulated higher resolution images generated by the trained ML models described herein rather than lower resolution inspection images (or adapting currently used nuisance filters for the simulated higher resolution images), the embodiments described herein can provide the improved nuisance filtering described above.

As design rules continue to shrink, optical inspections are becoming nuisance limited. This limitation may cause leading edge semiconductor manufacturers to increasingly rely on electron microscopy for inspection, which comes with its own set of disadvantages. To reduce nuisance detection to acceptable levels on optical inspectors may require a reduction in nuisance rate by as much as or greater than 50× the current nuisance rates. By enabling significant nuisance reduction, the embodiments described herein enable such nuisance rate reductions while maintaining and even enabling higher sensitivity on optical inspection tools.

Figure 7:
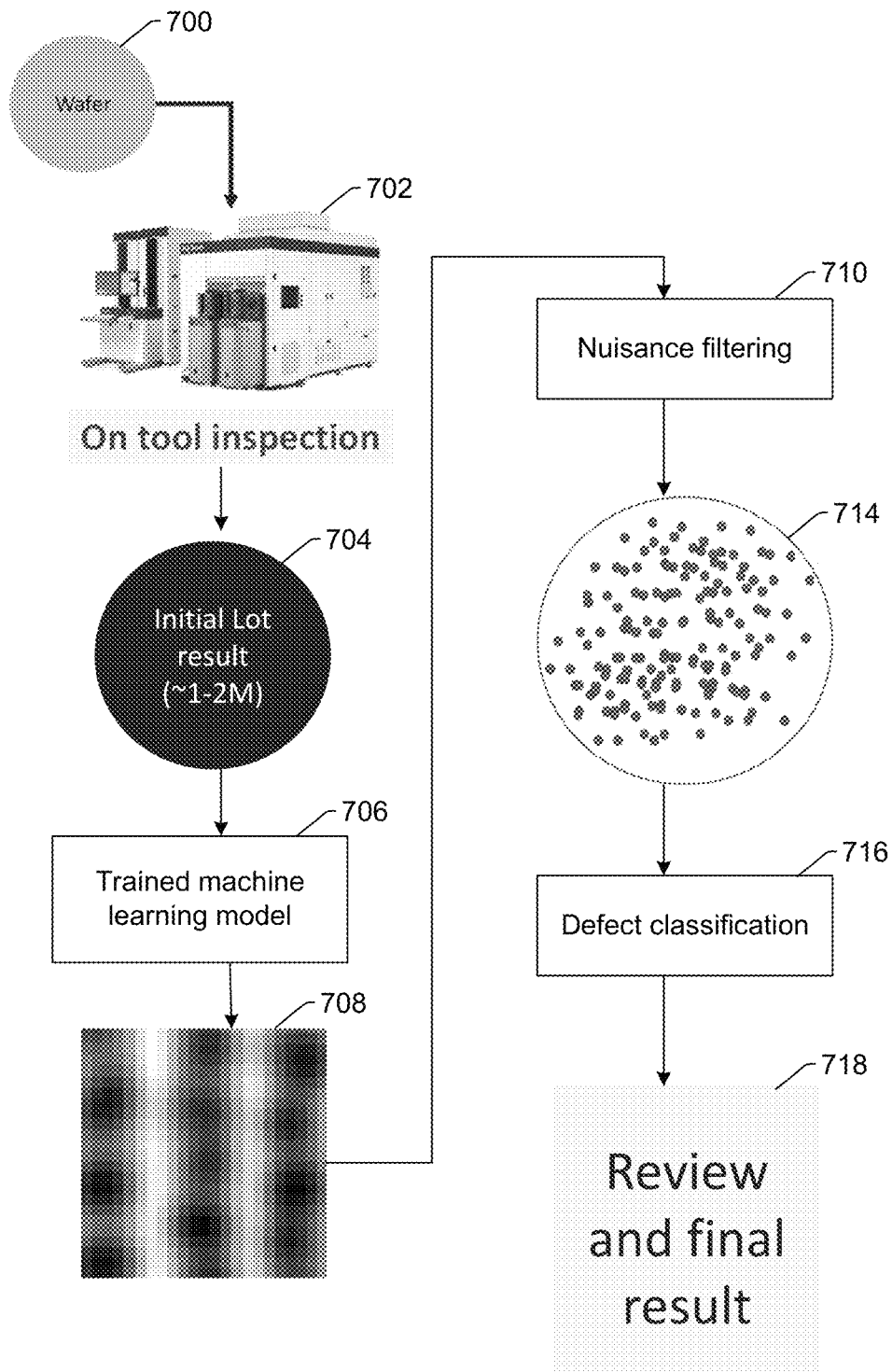
FIG. 7 is a flow chart illustrating one embodiment of steps that may be performed for determining information for a specimen.

FIG. 7 illustrates one embodiment of on tool inspection that may be performed by the embodiments described herein. In this embodiment, the specimen is wafer 700, which is loaded into inspection tool 702 that performs an on tool inspection of the specimen in which the specimen is scanned by tool 702 and images generated by the scanning are used to detect defects on the specimen. The output generated by the defect detection step may include initial lot result 704, which may include a substantial number of detected events (e.g., 1 million to 2 million detected events). The detected events may include both DOIs and nuisances (and even many more nuisances than DOIs typically), which may be separated from each other in an additional step.

The embodiments described herein may input the information in the initial lot result into trained ML model 706, which may be configured as described herein. In particular, test images generated for the events, possibly with corresponding reference images and design, may be input to the trained ML model, which generates higher resolution images 708 of the detected events. The one or more computer subsystems may or may not input the test images (and other optional inputs) for all of the detected events on the specimen. For example, the detected events in the initial lot result may be sampled in some manner, and then inspection images for only a sampled subset of the detected events may be input to the trained ML model.

In any case, higher resolution images 708 generated by the trained ML model may be input to nuisance filtering step 710, which may be performed as described herein. Output 714 of the nuisance filtering step may include any of the detected events that were not filtered out as nuisances. As shown schematically by the wafer map that represents the output of the nuisance filtering step, the number of detected events remaining after the nuisance filtering may be substantially less than the number of detected events reported by the on tool inspection.

In another embodiment, determining the information for the specimen from the generated higher resolution images includes classifying the defects detected by the inspection based on the generated higher resolution images. In this manner, the improved higher resolution images may be used for defect classification. Using the higher resolution images for defect classification can provide effective DOI binning. For example, the higher resolution images allow for better DOI binning at lower nuisance. In one such embodiment, if determining the information for the specimen also includes nuisance filtering, the output of the nuisance filtering step may be input to the defect classification. For example, as shown in FIG. 7, output 714 of nuisance filtering step 710 may be input to defect classification step 716. In this manner, only detected events that have not been filtered out by nuisance filtering may be input to the defect classification step.

Classifying the defects based on the generated higher resolution images may be performed using any suitable defect classification method or algorithm known in the art including both non-DL classification methods and DL classification methods. For example, simply by using currently available defect classifiers with the simulated higher resolution images generated by the trained ML models described herein rather than lower resolution inspection images (or adapting currently used defect classifiers for the simulated higher resolution images), the embodiments described herein can provide the improved defect classification described herein. In this manner, the generated higher resolution images may be input to the defect classification and used in the same manner as any other input to the defect classification.

The output generated by the defect classification step may be input to post-processing step 718, which may include defect review and generating the final inspection results. The post-processing may include sampling defects not filtered by the nuisance filtering and/or classified by the defect classification for defect review. The defect review may be performed to generate actual, non-simulated higher resolution images that can then be used to determine which of the sampled events are actual defects and which are nuisances and to determine a defect type or classification of the actual defects. In this manner, defect review may determine which of the detected events are DOIs and identify the type or classification of the DOI (when it is possible that different types of DOIs may be present on a specimen) using non-simulated higher resolution images.

In the embodiments described herein, the higher resolution images generated by the trained ML model may make defect review largely unnecessary since the defect review process may not be needed to generate the higher resolution images usually used for nuisance filtering and defect classification. However, in the embodiments described herein, defect review may include generating actual higher resolution images for a sample of events, filtered and non-filtered events, and/or classified or unclassified defects for a number of reasons such as checking the performance of the nuisance filtering, verifying the defect classification results, and classifying any defects that could not be classified based on the simulated higher resolution images.

The actual higher resolution images generated by a defect review tool may also be used in some instances to check whether the trained ML model is still performing adequately and/or whether one or more parameters of the trained ML model should be tuned, which can be performed to account for changes or drift in the process(es) used to form the design on the specimen or in the inspection tool.

The embodiments described herein can significantly reduce the amount of time involved in and the cost of defect review used to check the inspection results for nuisances and/or to perform defect classification. The embodiments described herein may even make possible review-less inspection in which the higher resolution images generated by the trained ML model from the inspection images can be used in place of any defect review images thereby reducing or even eliminating the need for on-tool defect review time. In other words, the images generated by inspection can, through their higher resolution images generated by the trained ML model, be used for defect review type functions like nuisance filtering and defect classification thereby moving the defect review to the inspection tool.

The computer subsystem(s) may be configured for storing a variety of information, images, etc. generated by the embodiments described herein. For example, the computer subsystem(s) may be configured for storing any or all of the simulated higher resolution images for the specimen and any or all of the information determined for the specimen from the simulated higher resolution images. Such images and information may also be stored with any or all of the images generated for the specimen by the inspection subsystem during inspection. Any or all of such information may be stored in any suitable manner and in any computer-readable storage medium described herein.

In another example, the computer subsystem(s) may be configured for storing the trained ML model for use in inspection of the specimen or another specimen of the same type. The computer subsystem(s) may be configured to store such a trained ML model in a recipe or by generating a recipe for the inspection in which the trained ML model will be used. A "recipe" as that term is used herein is defined as a set of instructions that can be used by a tool to perform a process on a specimen. In this manner, generating a recipe may include generating information for how a process is to be performed, which can then be used to generate the instructions for performing that process. The computer subsystem(s) may also store any information for the trained ML model that can be used to identify, access, and/or use the model (e.g., such as a file name and where it is stored). The information for the model that is stored may also include the code, instructions, algorithms, etc. for the model. The model and/or information therefor may be stored in any suitable manner in any of the computer-readable storage media described herein.

The trained ML model and/or information therefor may be stored with any of the other results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc. For example, the embodiments described herein may generate an inspection recipe as described above. That inspection recipe may then be stored and used by the system or method (or another system or method) to inspect the specimen or other specimens to thereby generate information (e.g., defect information) for the specimen or other specimens.

Results and information generated by performing the inspection on the specimen or other specimens of the same type may be used in a variety of manners by the embodiments described herein and/or other systems and methods. Such functions include, but are not limited to, altering a process such as a fabrication process or step that was or will be performed on the inspected specimen or another specimen in a feedback or feedforward manner. For example, the computer subsystem(s) described herein may be configured to determine one or more changes to a process that was performed on a specimen inspected as described herein and/or a process that will be performed on the specimen based on the detected defect(s). The changes to the process may include any suitable changes to one or more parameters of the process. The computer subsystem(s) described herein preferably determine those changes such that the defects can be reduced or prevented on other specimens on which the revised process is performed, the defects can be corrected or eliminated on the specimen in another process performed on the specimen, the defects can be compensated for in another process performed on the specimen, etc. The computer subsystem(s) described herein may determine such changes in any suitable manner known in the art.

Those changes can then be sent to a semiconductor fabrication system (not shown) or a storage medium (not shown) accessible to the computer subsystem(s) and the semiconductor fabrication system. The semiconductor fabrication system may or may not be part of the system embodiments described herein. For example, the computer subsystem(s) and/or inspection subsystem described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

As described herein, therefore, the embodiments can be used to setup a new inspection process or recipe. The embodiments may also be used to modify an existing inspection process or recipe, whether that is an inspection process or recipe that was used for the specimen or was created for one specimen and is being adapted for another specimen.

The embodiments described herein are not limited to inspection recipe or process creation or modification. For example, the embodiments described herein can also be used to setup or modify a recipe or process for metrology, defect review, etc. in a similar manner. In particular, the ML models described herein can be pre-trained and re-trained depending on the process that is being setup or revised (e.g., to generate higher resolution images from images generated during the process). Then, depending on the process or recipe that is being setup or altered, the higher resolution images generated by the trained ML model may be used to perform one or more functions during the process or during post-processing of output generated by the process. Although many quality control type processes like metrology and defect review are generally configured to generate substantially high resolution images or other output for specimens, by using a trained ML model described herein to simulate higher resolution images of a specimen, the resolution with which images are generated of the specimen during the process can possibly be reduced, which can improve throughput.

Each of the embodiments of each of the systems described above may be combined together into one single embodiment.

Another embodiment relates to a computer-implemented method for determining information for a specimen. The method includes the pre-training, re-training, inputting, and determining steps described herein, which are performed by one or more computer systems. One or more components are executed by the one or more computer systems. The one or more components include the trained ML model configured for transforming images of a specimen generated by the inspection subsystem into higher resolution images of the specimen.

Each of the steps of the method may be performed as described further herein. The method may also include any other step(s) that can be performed by the system, computer system(s), component(s), and/or trained ML models described herein. The computer system(s) may be configured according to any of the embodiments described herein, e.g., computer subsystem(s) 102. The one or more components and the trained ML model may also be configured according to any of the embodiments described herein. The method may be performed by any of the system embodiments described herein.

Figure 8:
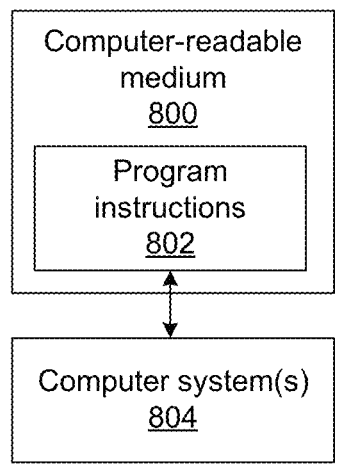
FIG. 8 is a block diagram illustrating one embodiment of a non-transitory computer-readable medium storing program instructions for causing computer system(s) to perform a computer-implemented method described herein.

An additional embodiment relates to a non-transitory computer-readable medium storing program instructions executable on one or more computer systems for performing a computer-implemented method for determining information for a specimen. One such embodiment is shown in FIG. 8. In particular, as shown in FIG. 8, non-transitory computer-readable medium 800 includes program instructions 802 executable on computer system(s) 804. The computer-implemented method may include any step(s) of any method(s) described herein.

Program instructions 802 implementing methods such as those described herein may be stored on computer-readable medium 800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system(s) 804 may be configured according to any of the embodiments described herein.

Further modifications and alternative embodiments of various aspects of the invention will be apparent to those skilled in the art in view of this description. For example, methods and systems for determining information for a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine information for a specimen, comprising:
    an inspection subsystem configured to generate images of a specimen;
    one or more computer subsystems; and
    one or more components executed by the one or more computer subsystems, wherein the one or more components comprise a trained machine learning model configured for transforming the images of the specimen generated by the inspection subsystem into higher resolution images of the specimen;
    wherein the one or more computer subsystems are configured for:
        pre-training an initial machine learning model with a pre-training set thereby generating a pre-trained machine learning model, wherein the pre-training set comprises only simulated inspection images of a test specimen designated as pre-training inputs and only corresponding simulated higher resolution images of the test specimen designated as pre-training outputs, and wherein the simulated inspection images and the corresponding simulated higher resolution images comprise simulated defects;
        re-training the pre-trained machine learning model with a training set thereby generating the trained machine learning model, wherein the training set comprises images generated for the test specimen by the inspection subsystem designated as training inputs and corresponding higher resolution images of the test specimen generated by a high resolution imaging system designated as training outputs;
        inputting the images generated for the specimen by the inspection subsystem during inspection into the trained machine learning model to thereby generate the higher resolution images of the specimen; and
        determining information for the specimen from the generated higher resolution images.

2. The system of claim 1, wherein a number of the images in the training set is less than a number of the simulated inspection images in the pre-training set, and wherein a number of the higher resolution images in the training set is less than a number of the simulated higher resolution images in the pre-training set.

3. The system of claim 1, wherein the one or more computer subsystems are further configured for generating the simulated inspection images and the simulated higher resolution images from a design for the test specimen.

4. The system of claim 3, wherein generating the simulated inspection images and the simulated higher resolution images comprises simulating process variations to the design formed on the test specimen by applying perturbations to the design representative of expected process variations thereby generating a perturbed design.

5. The system of claim 4, wherein applying the perturbations to the design is performed with a Gaussian process model.

6. The system of claim 4, wherein generating the simulated inspection images further comprises transforming the perturbed design into an image domain.

7. The system of claim 6, wherein transforming the perturbed design into the image domain is performed with a Partial Coherence Model.

8. The system of claim 1, wherein the simulated inspection images, simulated higher resolution images, images generated for the test specimen, and higher resolution images of the test specimen comprise only optical images.

9. The system of claim 1, wherein the simulated inspection images and images generated for the test specimen comprise only optical images, and wherein the simulated higher resolution images and higher resolution images of the test specimen comprise only electron beam images.

10. The system of claim 1, wherein the simulated inspection images, simulated higher resolution images, images generated for the test specimen, and higher resolution images of the test specimen comprise only electron beam images.

11. The system of claim 1, wherein the training set further comprises a design for the specimen.

12. The system of claim 1, wherein the initial machine learning model is a generative network.

13. The system of claim 1, wherein the initial machine learning model is a generative adversarial network.

14. The system of claim 1, wherein the initial machine learning model is an autoencoder.

15. The system of claim 1, wherein the one or more computer subsystems are further configured for inputting a design for the specimen into the trained machine learning model with the images generated for the specimen by the inspection subsystem during the inspection.

16. The system of claim 1, wherein determining the information for the specimen from the generated higher resolution images comprises performing nuisance filtering of defects detected by the inspection based on the generated higher resolution images thereby generating a filtered defect population for the specimen.

17. The system of claim 1, wherein determining the information for the specimen from the generated higher resolution images comprises classifying defects detected by the inspection based on the generated higher resolution images.

18. The system of claim 1, wherein the specimen is a wafer.

19. A non-transitory computer-readable medium, storing program instructions executable on one or more computer systems for performing a computer-implemented method for determining information for a specimen, wherein the computer-implemented method comprises:
    pre-training an initial machine learning model with a pre-training set thereby generating a pre-trained machine learning model, wherein the pre-training set comprises only simulated inspection images of a test specimen designated as pre-training inputs and only corresponding simulated higher resolution images of the test specimen designated as pre-training outputs, and wherein the simulated inspection images and the corresponding simulated higher resolution images comprise simulated defects;

re-training the pre-trained machine learning model with a training set thereby generating a trained machine learning model, wherein the training set comprises images generated for the test specimen by an inspection subsystem designated as training inputs and corresponding higher resolution images of the test specimen generated by a high resolution imaging system designated as training outputs;

wherein one or more components are executed by the one or more computer systems, and wherein the one or more components comprise the trained machine learning model configured for transforming images of a specimen generated by the inspection subsystem into higher resolution images of the specimen;

inputting the images generated for the specimen by the inspection subsystem during inspection into the trained machine learning model to thereby generate the higher resolution images of the specimen; and determining information for the specimen from the generated higher resolution images.

20. A computer-implemented method for determining information for a specimen, comprising:

pre-training an initial machine learning model with a pre-training set thereby generating a pre-trained machine learning model, wherein the pre-training set comprises only simulated inspection images of a test specimen designated as pre-training inputs and only corresponding simulated higher resolution images of the test specimen designated as pre-training outputs, and wherein the simulated inspection images and the corresponding simulated higher resolution images comprise simulated defects;

re-training the pre-trained machine learning model with a training set thereby generating a trained machine learning model, wherein the training set comprises images generated for the test specimen by an inspection subsystem designated as training inputs and corresponding higher resolution images of the test specimen generated by a high resolution imaging system designated as training outputs;

wherein one or more components are executed by one or more computer systems, and wherein the one or more components comprise the trained machine learning model configured for transforming images of a specimen generated by the inspection subsystem into higher resolution images of the specimen;

inputting the images generated for the specimen by the inspection subsystem during inspection into the trained machine learning model to thereby generate the higher resolution images of the specimen; and determining information for the specimen from the generated higher resolution images, wherein said pre-training, re-training, inputting, and determining are performed by the one or more computer systems.

\* \* \* \* \*